United States Patent
Huang et al.

(10) Patent No.: US 11,085,890 B1
(45) Date of Patent: Aug. 10, 2021

(54) SYSTEM FOR FACILITATING NON-INVASIVE IN-SITU IMAGING OF METABOLIC PROCESSES OF PLANTS

(71) Applicant: Royal Biotech Inc, Beverly Hills, CA (US)

(72) Inventors: Philip Huang, Westlake Village, CA (US); E-Ray Huang, Westlake Village, CA (US); Guozhi Lin, Changsha (CN); En I Tu, Richmond (CA)

(73) Assignee: ROYAL BIOTECH INC, Beverly Hills, CA (US)

( * ) Notice: Subject to any disclaimer, the term of this patent is extended or adjusted under 35 U.S.C. 154(b) by 0 days.

(21) Appl. No.: 16/779,120

(22) Filed: Jan. 31, 2020

(51) Int. Cl.
*G01N 24/08* (2006.01)

(52) U.S. Cl.
CPC .................. *G01N 24/08* (2013.01)

(58) Field of Classification Search
CPC ...................................................... G01N 24/08
See application file for complete search history.

(56) References Cited

U.S. PATENT DOCUMENTS

| | | | |
|---|---|---|---|
| 6,977,503 B2 * | 12/2005 | Prado | G01R 33/3806 324/319 |
| 7,367,155 B2 | 5/2008 | Kotyk et al. | |
| 8,188,742 B2 | 5/2012 | Utturkar et al. | |
| 9,594,132 B2 | 3/2017 | Van Helvoort | |
| 10,359,481 B2 | 7/2019 | Wald et al. | |
| 2014/0155732 A1 | 6/2014 | Patz et al. | |
| 2016/0011290 A1 * | 1/2016 | Iannello | G01R 33/56527 600/309 |
| 2018/0164390 A1 * | 6/2018 | Poole | G01R 33/4215 |
| 2018/0251333 A1 | 9/2018 | Knierim et al. | |

FOREIGN PATENT DOCUMENTS

CN 101950007 B 1/2011

OTHER PUBLICATIONS

Cooley, Clarissa Zimmerman, Portable low-cost magnetic resonance imaging, Massachusetts Institute of Technology. Department of Electrical Engineering and Computer Science, 2014.

* cited by examiner

*Primary Examiner* — Jay Patidar

(57) ABSTRACT

According to some embodiments, a system for facilitating non-invasive in-situ imaging of metabolic processes of plants is disclosed. The system may include a frame comprises a frame body and a base member. Further, the system may include at least one rare-earth permanent magnet disposed on the frame. Further, the system may include at least one arm coupled to the frame. Further, the system may include at least one coil disposed on a first end of an arm of the at least one arm. Further, the system may include at least one sensor disposed on the frame. Further, the system may include a processing device communicatively coupled with the at least one sensor and the at least one coil. Further, the system may include an actuator communicatively coupled with the processing device. Further, the system may include a presentation device disposed on the frame.

14 Claims, 6 Drawing Sheets

SYSTEM FOR FACILITATING NON-INVASIVE IN-SITU IMAGING OF METABOLIC PROCESSES OF PLANTS

FIELD OF THE INVENTION

Generally, the present disclosure relates to a magnetic resonance imaging apparatus. More specifically, the present disclosure relates to systems for facilitating non-invasive in-situ imaging of metabolic processes of plants.

BACKGROUND OF THE INVENTION

Exploration of the internal mechanism of plants in nature (specifically their metabolic processes), will help humanity develop a more in-depth comprehensive understanding about the plants. Currently the observation techniques of metabolic processes in vivo plants, mostly can only be used in the laboratory or greenhouse. Further, these techniques, are not yet for non-invasive, outdoor in-situ living plant metabolism. Magnetic resonance imaging (MRI) can non-invasively track the H trajectory of the water molecule of plants.

However, the conventional MRI suffers from several problems including restricted to use in laboratory or greenhouses. There use is restricted to big, strict and costly space facilities. Further, they are heavyweight and occupy a big volume. Further, the equipment system cost is huge and the maintenance costs are high. Further, operators must be rigorously trained. They have long imaging time and there is a high probability of artifacts. Moreover, the semiconductor magnets consume a lot of energy. Accordingly, existing techniques for exploring internal mechanism of plants are deficient with regard to several aspects.

Therefore, there is a need for improved systems for facilitating non-invasive in-situ imaging of metabolic processes of plants that may overcome one or more of the above-mentioned problems and/or limitations.

SUMMARY OF THE INVENTION

This summary is provided to introduce a selection of concepts in a simplified form, that are further described below in the Detailed Description. This summary is not intended to identify key features or essential features of the claimed subject matter. Nor is this summary intended to be used to limit the claimed subject matter's scope.

According to some embodiments, a system for facilitating non-invasive in-situ imaging of metabolic processes of plants is disclosed. The system may include a frame comprises a frame body and a base member, wherein the base member is configured to be placed on at least one surface, wherein the base member is configured for supporting the frame body. Further, the system may include at least one rare-earth permanent magnet disposed on the frame, wherein the at least one rare-earth permanent magnet configured for creating a magnetic field around the at least one plant sample, wherein the at least one rare-earth permanent magnet facilitates excitation of the at least one plant sample. Further, the system may include at least one arm coupled to the frame, wherein the at least one arm is configured to move through a plurality of arm positions in relation to the frame. Further, the system may include at least one coil disposed on a first end of an arm of the at least one arm, wherein the at least one coil is configured for partly encompassing the at least one plant sample, wherein the at least one coil facilitates the excitation of the at least one plant sample, wherein the at least one coil is configured for receiving at least one response from the at least one plant sample corresponding to the excitation. Further, the system may include at least one sensor disposed on the frame, wherein the at least one sensor is configured for generating at least one sensor data, wherein the at least one sensor data is associated with at least one characteristic of the at least one plant sample. Further, the system may include a processing device communicatively coupled with the at least one sensor and the at least one coil. The processing device may be configured for analyzing the at least one sensor data. Further, the processing device may be configured for generating an arm control command based on the analyzing. Further, the processing device may be configured for processing the at least one response. Further, the processing device may be configured for generating plant data associated with at least one metabolic process of the at least one plant sample based on the processing. Further, the system may include an actuator communicatively coupled with the processing device, wherein the actuator is operationally coupled with the at least one arm, wherein the actuator is configured for moving the at least one arm through the plurality of arm positions based on the arm control command. Further, the system may include a presentation device disposed on the frame, wherein the presentation device is communicatively coupled with the processing device, wherein the presentation device is configured for presenting the plant data.

Both the foregoing summary and the following detailed description provide examples and are explanatory only. Accordingly, the foregoing summary and the following detailed description should not be considered to be restrictive. Further, features or variations may be provided in addition to those set forth herein. For example, embodiments may be directed to various feature combinations and subcombinations described in the detailed description.

BRIEF DESCRIPTION OF DRAWINGS

The accompanying drawings, which are incorporated in and constitute a part of this disclosure, illustrate various embodiments of the present disclosure. The drawings contain representations of various trademarks and copyrights owned by the Applicants. In addition, the drawings may contain other marks owned by third parties and are being used for illustrative purposes only. All rights to various trademarks and copyrights represented herein, except those belonging to their respective owners, are vested in and the property of the applicants. The applicants retain and reserve all rights in their trademarks and copyrights included herein, and grant permission to reproduce the material only in connection with reproduction of the granted patent and for no other purpose.

Furthermore, the drawings may contain text or captions that may explain certain embodiments of the present disclosure. This text is included for illustrative, non-limiting, explanatory purposes of certain embodiments detailed in the present disclosure.

DETAIL DESCRIPTIONS OF THE INVENTION

Figure 1:
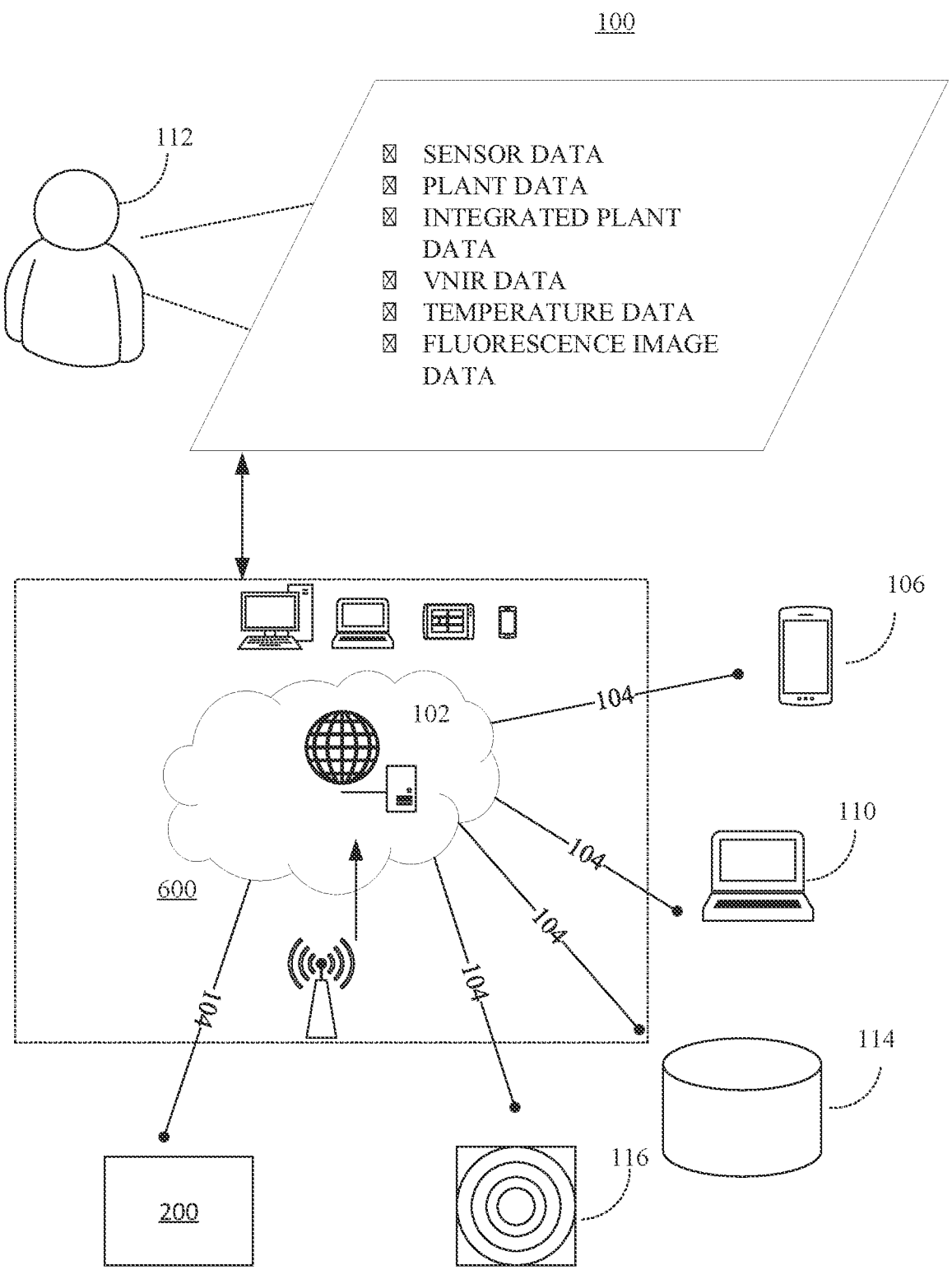
FIG. 1 is an illustration of an online platform consistent with various embodiments of the present disclosure.

As a preliminary matter, it will readily be understood by one having ordinary skill in the relevant art that the present disclosure has broad utility and application. As should be understood, any embodiment may incorporate only one or a plurality of the above-disclosed aspects of the disclosure and may further incorporate only one or a plurality of the above-disclosed features. Furthermore, any embodiment discussed and identified as being "preferred" is considered to be part of a best mode contemplated for carrying out the embodiments of the present disclosure. Other embodiments also may be discussed for additional illustrative purposes in providing a full and enabling disclosure. Moreover, many embodiments, such as adaptations, variations, modifications, and equivalent arrangements, will be implicitly disclosed by the embodiments described herein and fall within the scope of the present disclosure.

Accordingly, while embodiments are described herein in detail in relation to one or more embodiments, it is to be understood that this disclosure is illustrative and exemplary of the present disclosure, and are made merely for the purposes of providing a full and enabling disclosure. The detailed disclosure herein of one or more embodiments is not intended, nor is to be construed, to limit the scope of patent protection afforded in any claim of a patent issuing here from, which scope is to be defined by the claims and the equivalents thereof. It is not intended that the scope of patent protection be defined by reading into any claim limitation found herein and/or issuing here from that does not explicitly appear in the claim itself.

Thus, for example, any sequence(s) and/or temporal order of steps of various processes or methods that are described herein are illustrative and not restrictive. Accordingly, it should be understood that, although steps of various processes or methods may be shown and described as being in a sequence or temporal order, the steps of any such processes or methods are not limited to being carried out in any particular sequence or order, absent an indication otherwise. Indeed, the steps in such processes or methods generally may be carried out in various different sequences and orders while still falling within the scope of the present disclosure. Accordingly, it is intended that the scope of patent protection is to be defined by the issued claim(s) rather than the description set forth herein.

Additionally, it is important to note that each term used herein refers to that which an ordinary artisan would understand such term to mean based on the contextual use of such term herein. To the extent that the meaning of a term used herein—as understood by the ordinary artisan based on the contextual use of such term-differs in any way from any particular dictionary definition of such term, it is intended that the meaning of the term as understood by the ordinary artisan should prevail.

Furthermore, it is important to note that, as used herein, "a" and "an" each generally denotes "at least one," but does not exclude a plurality unless the contextual use dictates otherwise. When used herein to join a list of items, "or" denotes "at least one of the items," but does not exclude a plurality of items of the list. Finally, when used herein to join a list of items, "and" denotes "all of the items of the list."

The following detailed description refers to the accompanying drawings. Wherever possible, the same reference numbers are used in the drawings and the following description to refer to the same or similar elements. While many embodiments of the disclosure may be described, modifications, adaptations, and other implementations are possible. For example, substitutions, additions, or modifications may be made to the elements illustrated in the drawings, and the methods described herein may be modified by substituting, reordering, or adding stages to the disclosed methods. Accordingly, the following detailed description does not limit the disclosure. Instead, the proper scope of the disclosure is defined by the claims found herein and/or issuing here from. The present disclosure contains headers. It should be understood that these headers are used as references and are not to be construed as limiting upon the subjected matter disclosed under the header.

The present disclosure includes many aspects and features. Moreover, while many aspects and features relate to, and are described in the context of systems for facilitating non-invasive in-situ imaging of metabolic processes of plants, embodiments of the present disclosure are not limited to use only in this context.

Referring now to figures. FIG. 1 is an illustration of an online platform 100 consistent with various embodiments of the present disclosure. By way of non-limiting example, the online platform 100 to facilitate systems for facilitating non-invasive in-situ imaging of metabolic processes of plants may be hosted on a centralized server 102, such as, for example, a cloud computing service. The centralized server 102 may communicate with other network entities, such as, for example, a mobile device 106 (such as a smartphone, a laptop, a tablet computer, etc.), other electronic devices 110 (such as desktop computers, server computers etc.), databases 114, and sensors 116 over a communication network 104, such as, but not limited to, the Internet. Further, users of the online platform 100 may include relevant parties such as, but not limited to, end-users, administrators, and so on. Accordingly, in some instances, electronic devices operated by the one or more relevant parties may be in communication with the platform 100.

A user 112, such as the one or more relevant parties, may access online platform 100 through a web-based software application or browser. The web-based sofvare application may be embodied as, for example, but not be limited to, a website, a web application, a desktop application, and a mobile application compatible with a computing device 600.

Figure 2:
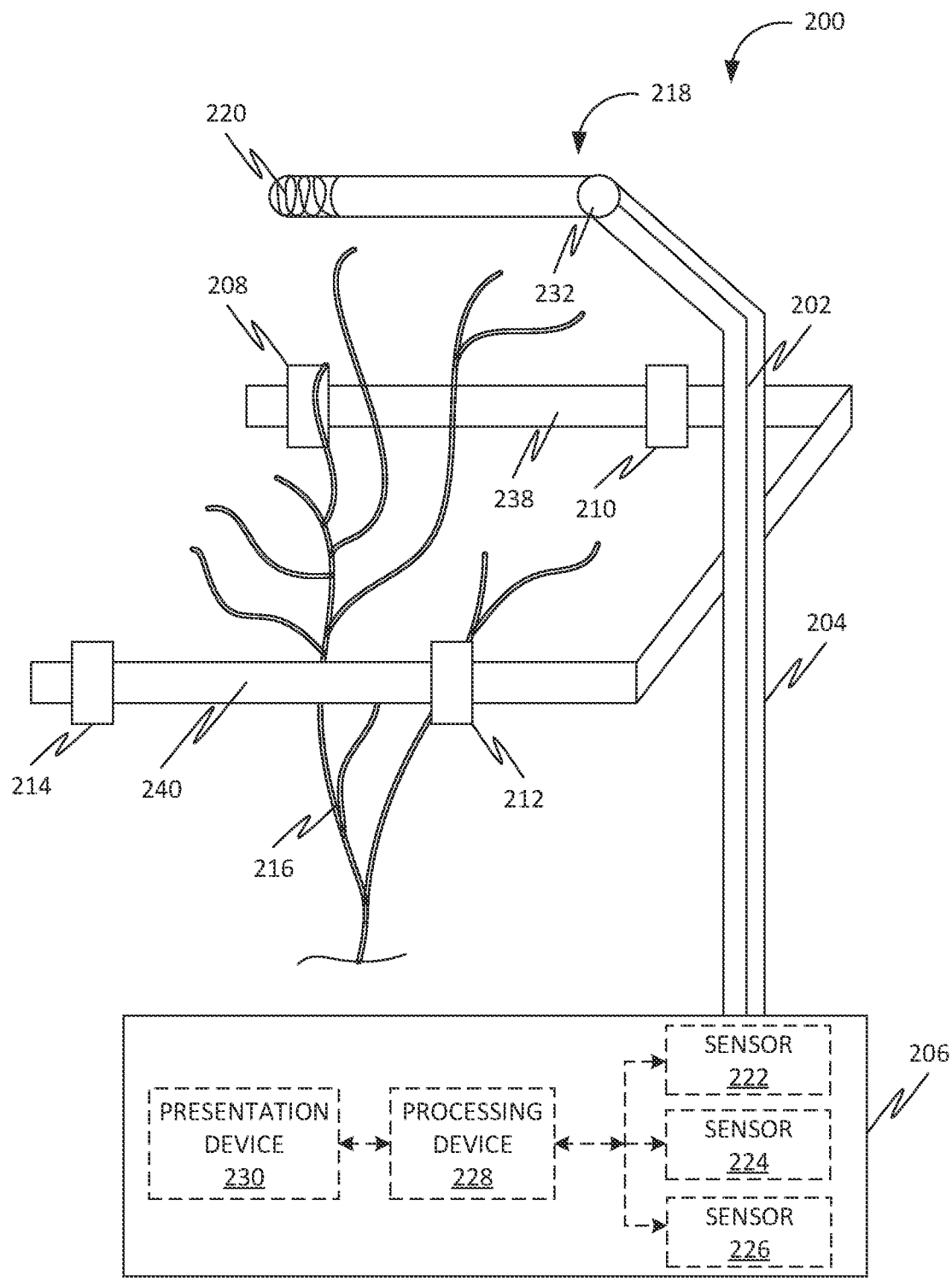
FIG. 2 is a schematic of a system for facilitating non-invasive in-situ imaging of metabolic processes of plants, in accordance with some embodiments.

FIG. 2 is a schematic of a system 200 for facilitating non-invasive in-situ imaging of metabolic processes of plants, in accordance with some embodiments. Further, the system 200 may include a frame 202 comprises a frame body 204 and a base member 206. Further, the base member 206 may be configured to be placed on at least one surface. Further, the base member 206 is configured for supporting the frame body 204.

According to some embodiments, the frame body 204 may include at least one frame wall and a frame enclosure formed by the at least one frame wall. Further, one or more rare-earth permanent magnets 208-214 may be disposed within the frame enclosure.

According to some embodiments, the at least one frame wall may include at least one composite material. Further, the at least one composite material may include carbon fiber and copper. Further, the at least one composite material provides electromagnetic shielding to the frame enclosure.

Further, the system 200 may include the one or more rare-earth permanent magnets 208-214 disposed on the frame 202. Further, the one or more rare-earth permanent magnets 208-214 may be configured for creating a magnetic field around at least one plant sample 216. Further, the one or more rare-earth permanent magnets 208-214 may facilitate excitation of the at least one plant sample 216.

According to some embodiments, the one or more rare-earth permanent magnets 208-214 may include two planer rare-earth permanent magnets and four upright rare-earth permanent magnets. Further, a first planer rare-earth permanent magnet may be disposed juxtaposed to a second planer rare-earth permanent magnet. Further, each upright rare-earth permanent magnet of the four upright permanent magnets may include a first upright end and a second upright end. Further, the first upright end may be attached to a first distal end of the first planar rare-earth permanent magnet and the second upright end is attached to a second distal end of the second planar rare-earth permanent magnet. Further, the first distal end may be juxtaposed to the second distal end.

Further, the system 200 may include at least one arm 218 coupled to the frame 202. Further, the at least one arm 218 may be configured to move through a plurality of arm positions in relation to the frame 202.

Further, the system 200 may include at least one coil 220 disposed on a first end of an arm of the at least one arm 218. Further, the at least one coil 220 may be configured for partly encompassing the at least one plant sample 216. Further, the at least one coil 220 may facilitate the excitation of the at least one plant sample 216. Further, the at least one coil 220 may be configured for receiving at least one response from the at least one plant sample 216 corresponding to the excitation.

Further, the system 200 may include one or more sensors 222-226 disposed on the frame 202. Further, the one or more sensors 222-226 may be configured for generating at least one sensor data. Further, the at least one sensor data may be associated with at least one characteristic of the at least one plant sample 216.

Further, the system 200 may include a processing device 228 communicatively coupled with the one or more sensors 222-226 and the at least one coil 220. Further, the processing device 228 may be configured for analyzing the at least one sensor data. Further, the processing device 228 may be configured for generating an arm control command based on the analyzing. Further, the processing device 228 may be configured for processing the at least one response. Further, the processing device 228 may be configured for generating plant data associated with at least one metabolic process of the at least one plant sample 216 based on the processing.

Further, the system 200 may include an actuator 232 communicatively coupled with the processing device 228. Further, the actuator 232 may be operationally coupled with the at least one arm 218. Further, the actuator 232 may be configured for moving the at least one arm 218 through the plurality of arm positions based on the arm control command. For instance, the actuator 232 may be a servo motor installed in the frame 202.

Further, the system 200 may include a presentation device 230 disposed on the frame 202. Further, the presentation device 230 may be communicatively coupled with the processing device 228. Further, the presentation device 230 may be configured for presenting the plant data.

According to some embodiments, the at least one coil 220 may include at least two coil panels. Further, each coil panel in the at least two coil panels may include a first periphery and a second periphery. Further, the first periphery of a primary coil panel may be movably coupled with the second periphery of a secondary coil panel using at least one coupling mechanism. Further, the primary coil panel may be configured to move through a plurality of coil positions in relation to the secondary coil panel forming at least one curvature. Further, the at least one coil curvature may be configured for securing of the at least one plant sample 216 by partially encompassing the at least one plant sample 216.

According to further embodiments, the processing device 228 may be configured for generating a coil control command based on the analyzing. Further, the actuator 232 may be operationally coupled with the at least one coil 220. Further, the actuator 232 may be configured for moving the primary coil panel through the plurality of coil positions in relation to the secondary coil panel based on the coil control command.

According to some embodiments, the at least one coil 220 may include at least one coil panel. Further, the at least one coil panel may be curved with at least one curvature forming a coil interior space, Further, the at least one coil panel may include at least one panel opening. Further, the coil interior space may be configured for partially receiving the at least one plant sample 216 through the at least one panel opening.

Figure 4:
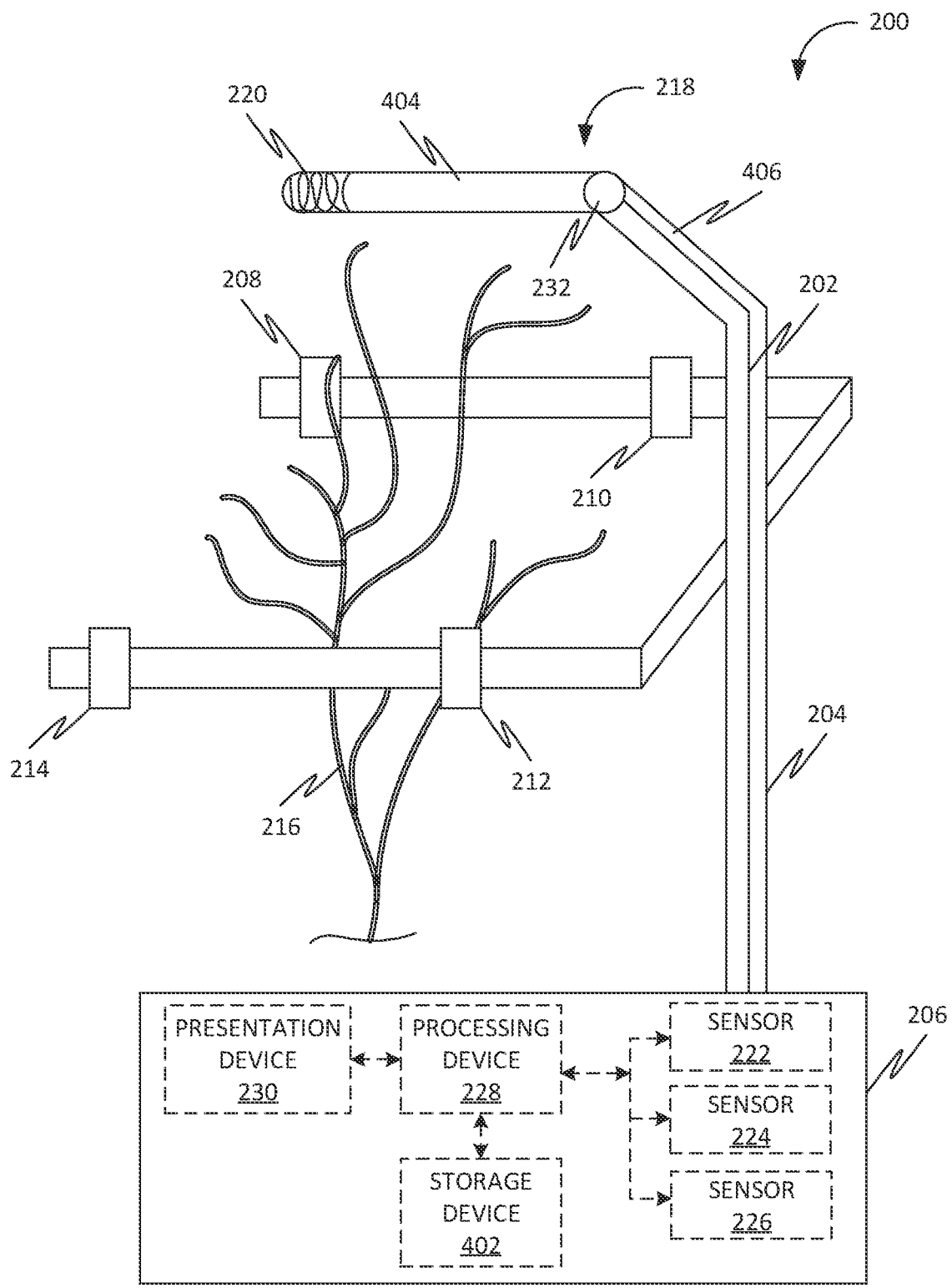
FIG. 4 is a schematic of the system for facilitating non-invasive in-situ imaging of metabolic processes of plants, in accordance with further embodiments.

According to some embodiments, an arm of the at least one arm 218 may include at least two arm sections 404-406, as shown in FIG. 4, that is, a primary arm section 404 is nested in a secondary arm section 406. Further, the primary arm section 404 may be expendably coupled with the secondary arm section 406. Further, the primary arm section 404 may be configured for extending through a plurality of arm positions along an arm axis in relation to the secondary arm section 406.

According to further embodiments, the processing device 228 may be configured for generating an arm control command based on the analyzing. Further, the actuator 232 may be configured for extending the primary arm section 404 through the plurality of arm positions along the arm axis in relation to the secondary arm section 406 based on the arm control command.

Figure 3:
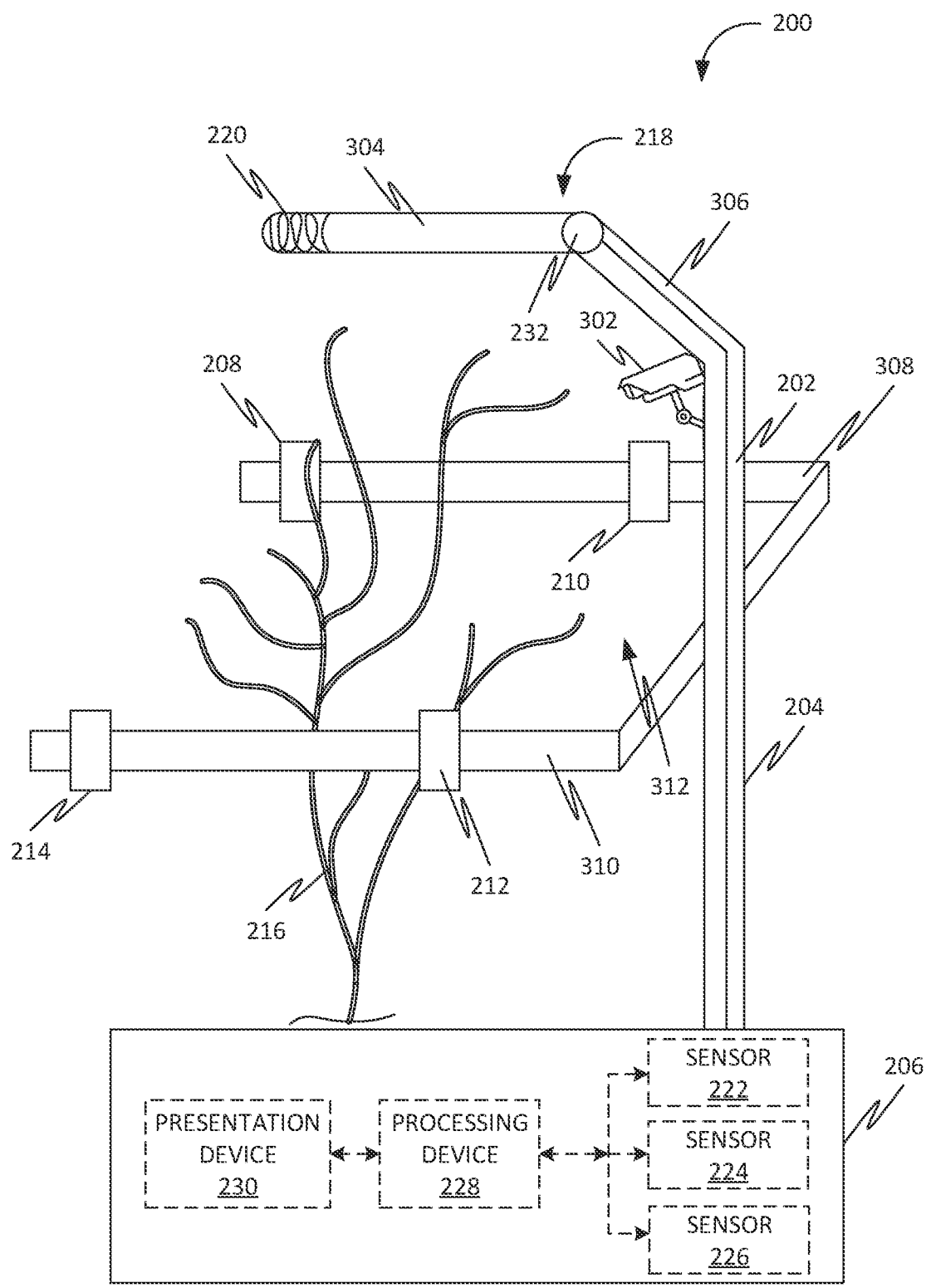
FIG. 3 is a schematic of the system for facilitating non-invasive in-situ imaging of metabolic processes of plants, in accordance with further embodiments.

According to some embodiments, an arm of the at least one arm 218 may include a primary arm section 304, as shown in FIG. 3, rotatable coupled with a secondary arm section 306, as shown in FIG. 3. Further, the primary arm section 304 may be configured for rotating through a plurality of arm positions around a rotating axis in relation to the secondary arm section 306.

According to further embodiments, the processing device 228 may be configured for generating an arm control command based on the analyzing. Further, the actuator 232 may be configured for rotating the primary arm section 304 through the plurality of arm positions around the rotating axis in relation to the secondary arm section 306 based on the arm control command.

According to some embodiments, the system 200 may include a non-power fluorescence imaging sensor disposed on the frame 202. The one or more sensors 222-226 may include the non-power fluorescence imaging sensor. Further, the non-power fluorescence imaging sensor may be configured for generating at least one fluorescence data. Further, the at least one fluorescence data may be associated with a photosynthesis process of the at least one metabolic process of the at least one plant sample 216. Further, the processing device 228 may be communicatively coupled with the non-power fluorescence imaging sensor. Further, the processing device 228 may be configured for processing the at least one fluorescence data. Further, the plant data may be generated based on the processing of the fluorescence image data.

According to some embodiments, the system 200 may include at least one temperature sensor disposed on the frame body 204. For example, the one or more sensors 222-226 may include the at least one temperature sensor. Further, the at least one temperature sensor may be configured for generating at least one temperature data associated with the one or more rare-earth permanent magnets 208-214. Further, the processing device 228 may be communicatively coupled with the at least one temperature sensor. Further, the processing device 228 may be configured for analyzing the at least one temperature data. Further, the processing device 228 may be generating a temperature command based on the analyzing of the at least one temperature data.

Further, the system 200 may include at least one air cooling assembly 238-240 disposed on the frame 202. Further, the at least one air cooling assembly 238-240 may be communicatively coupled with the processing device 228. Further, the at least one air cooling assembly 238-240 may be configured for controlling an ambient temperature associated with the one or more rare-earth permanent magnets 208-214 based on the temperature command.

According to further embodiments, the frame 202 may include a first body portion 308, as shown in FIG. 3, and a second body portion 310, as shown in FIG. 3. Further, the first body portion 308 may be coupled to the second body portion 310 using at least one coupling mechanism. Further, the first body portion 308 may be configured to move through a plurality of body positions in relation to the second body portion 310 forming a body interior space 312. Further, the body interior space 312 may be configured for receiving the at least one plant sample 216.

According to further embodiments, the processing device 228 may be configured for generating a frame control command based on the analyzing. Further, the actuator 232 may be operationally coupled with the frame 202. Further, the actuator 232 may be configured for moving the first body portion 308 through the plurality of body positions in relation to the second body portion 310 based on the frame control command.

According to some embodiments, the frame 202 may include at least one propulsion assembly. Further, the at least one propulsion assembly may be attached to the base member 206. Further, the at least one propulsion assembly may be configured for propelling the frame 202 in a plurality of directions in relation to the frame 202. According to further embodiments, the processing device 228 may be configured for generating a propulsion control command based on the analyzing. Further, the at least one propulsion assembly may be operationally coupled with the processing device 228. Further, the at least one propulsion assembly may be configured for propelling the frame 202 in the plurality of directions in relation to the frame 202 based on the propulsion control command.

Further, the system 200 may include a communication device (not shown). Further, the communication device may be disposed on the frame 202. Further, the communication device may be communicatively coupled with the processing device 228. Further, the communication device may be configured for receiving at least one additional image data from at least one imaging device. Further, the at least one imaging device may be configured for generating the at least one additional image data associated with the at least one plant sample 216. Further, the at least one imaging device may include a mass spectrometer, a cryogenic electron microscope, a ramen spectrometer, etc. Further, the processing device 228 may be configured for analyzing the at least one additional image data and the plant data. Further, the processing device 228 may be configured for generating integrated plant data based on the analyzing. Further, the presentation device 230 may be configured for presenting the integrated plant data.

According to some embodiments, the one or more rare-earth permanent magnets 208-214 may include a high-temperature superconductivity sensor. Further, the high-temperature superconductivity sensor is configured for generating the magnetic field around the at least one plant sample. Further, the high-temperature superconductivity sensor is configured for generating the magnetic field without a coolant.

Further, the high-temperature superconductivity sensor may include an electromagnet coil. Further, the electromagnet coil may be configured for generating the magnetic field.

FIG. 3 is a schematic of the system 200 for facilitating non-invasive in-situ imaging of metabolic processes of plants, in accordance with further embodiments. Further, the system 200 may include a visible and near infrared (VNIR) camera 302 disposed on the frame 202. Further, the VNIR camera 302 may be configured for generating at least one VNIR data. Further, the at least one VNIR data may be associated with at least one metabolic process of the at least one plant sample 216. Further, the processing device 228 may be communicatively coupled with the VNIR camera 302. Further, the processing device 228 may be configured for processing the at least one VNIR data. Further, the plant data may be generated based on the processing of the at least one VNIR data.

FIG. 4 is a schematic of the system 200 for facilitating non-invasive in-situ imaging of metabolic processes of plants, in accordance with further embodiments. Further, the system 200 may include a storage device 402 communicatively coupled with the processing device 228. Further, the storage device 402 may be configured for retrieving historical plant data associated with the at least one plant sample 216 from a database. Further, the processing device 228 may be configured for analyzing the historical plant data and the plant data. Further, the processing device 228 may be configured for generating processed plant data based on the analyzing of the historical plant data and the plant data. Further, the presentation device 230 may be configured for presenting the processed plant data.

In further embodiments, the storage device 402 may be configured for storing the plant data.

Further, the disclosure may relate to portable neutron Magnetic Resonance Imaging (nMRI) for capturing images of key metabolic processes. Conventional portable nMRI may have specifications including 0.2T units and 70×50×45 cm footprint with minimum 540 kilograms (excluding consoles) for in situ, non-destructive, functional imagining and qualitative measurement of key metabolic processes in living plants. Further, combining rare earth permanent magnet with direct to air thermoelectric cooling assemblies, automatic data integrated analysis tools provide a 92% upgrade on the image resolutions at a competitive price.

Further, the magnet and the coils of nMRI may be changed. Further, the data integration and analysis tools may be redesigned to develop a portable model of in situ bioimaging system. Without coolant, the electricity cost maybe less than 20% of the electricity cost of most of the current nMRI machines. Using a non-destructive detection method similar to traditional nMRI, functional metabolic imaging of plants may be captured at anytime and anywhere. Further, considering the diversity of the test subjects, the portable design provides flexibility with surface coils and volumes coils, which increases the field of view of the sample by 30%. Further, there are three factors that have major effects on nMRI imaging quality: 1) signal to noise ratio (S/N) with resolution 2) temperature, humidity, and airflow control 3) the fill level of probe.

Further, the application of a high-temperature superconductivity RF coils may result in a 3× higher S/N that will lead to a major upgrade for imaging quality of in-field-plant. Further, the high-temperature superconductivity RF coil does not require coolant. Further, a high-temperature superconductivity sensor may include the high-temperature superconductivity RF coils. Further, in some embodiment, the high-temperature superconductivity sensor without coolant may be configured for generating a magnetic field around at least one plant sample. By programming a system with a self-calibration function, it may reduce the artifact. Further, multi-channel arrays may be used with parallel imaging technology (sub-second imaging). Thereafter, the onsite Closed Space may be designed to re-duce other interferences by 90%, such as temperature, humidity and airflow. Further, portable nMRI's industrial target may be 100 kg, 50/60 Hz, 220-480 V, with real-time detection.

Most artifacts are due to hardware calibration. The portable nMRI may decrease the artifacts by 85% by using automatic hardware and related parameter calibration check, leading to less misjudgment. Furthermore, it may offer a higher resolution of 3D imaging. This may become the new industrial standard for in situ plant sciences research.

Accordingly, a portable nMRI program may combine 2D images, calculated by a computer, to produce a 3D image of a specific area. Further, data integration and analysis may involve integrating the data info from mass Spectrometry, cryogenic electron microscopy, Ramen spectrometry, etc. Further, the automatic hardware may be related to parameter calibration check.

According to some embodiments, a portable MRI is designed to be an intelligent MRI. Accordingly, the operator of the portable MRI does not require extensive training such as basic 6 credit training courses. The operator needs just 2 hours of training.

Further, machine and deep learning technology may be integrated with the portable MRI for ease of use. The machine and deep learning technology may include use of chat-bots. Further, an anti-interference cover may be designed for the operation of the portable MRI to be used outdoors. Further, the portable MRI may be made of materials such as the carbon fiber composite integrated copper tape. Further, environmental temperature/humidity control may be employed with available sensors.

Further, the portable MRI may set up a self-correction/calibration function for system decreasing artifact. Further, software may be used to provide solutions for some of the problems with the conventions MRI. Further, software may be used for performing self-correction (or calibration) for portable MRI design. The self-correction for any errors automatically. The portable MRI may be operated by users without professional backgrounds/training. Further, the portable MRI for plants may be integrated with various conventional technologies/materials into new tools.

Further, the present disclosure may describe an automated portable intelligent MRI for plants. The structure of the equipment may include a control center, energy manufacturing and transmission center, and main system architecture.

The control center may include a circuit board (PCB), combined with software program with functions such as image editing, analysis, signal image superimposition, image comparison, etc. Further, control center may include data memory area (knowledge input), analysis logic operation area, depth of learning, knowledge input, education intelligent devices, to study the information (for example: artifacts, etc.), and neurons in the control area (provide operational command of the various components, receive the transmission reflect).

During startup, a detector (electric eye) may be used to lock a target sample. Further, relevant sample information (for example, distance, sample image, etc.) may be transferred to the control center. Further, a control center search database may be used to verify the sample identity and classify the relevant information. Further, the control center may issue work instructions to each component of the equipment. Further, each component starts the division of work and returns the collected parameters to the control center. Further, the control center studies and judges based on the collected data and adjusts the work instructions.

Further, the equipment includes a pulley device to automatic move the target sample. Further, a distance detection sensor may be used with inductive proximity "target sample". This information is collected and transmitted to the control center. When the equipment approaches target sample, is automatically splits into two "chassis", continues to promote next to about two chassis central semicircular aperture position, surrounding the "target sample" by the two chassis inner hole position. The target sample, for example: tree stalk, except for the part inside the chassis, the other parts protrude from the top and bottom of the chassis.

Further, the detector (electric eye) may be turned on to detect environment and target parameters. The feedback parameter information is transmitted to the control center. Further, the control center may then issue work orders. Further, a specific area of the target sample for detection may be identified. Further, "near-infrared" (Visible and Near-Infrared—VNIR) monitoring may be turned on. Further, the information may be transferred back to the control center. Further, the information may be uploaded to a cloud for image reconstruction and an image analysis report may be issued.

Further, a "temperature controller" and "a robot" may be turned on. Further, volumes coil or surface coil for enclosing or covering of the target sample may be selected.

Further, the hold on the target sample may be tightened. Further, the RF Receiver may send information back to the control center. Further, information may be uploaded to the cloud for image reconstruction and an image analysis report may be issued.

Further, the central control center may communicate with a peripheral "ten-inch touch-screen" and "remote operation type" (including, Password, the User ID). If necessary, touch screen, the remote cellphone/pc may be used for forcing shutdown (or manual adjustment instruction) to facilitate the operation of the equipment to keep abreast of the distal.

Further, the Energy Manufacturing & Transmission Center may include a battery (Lithium Batteries) and 40×30 CM solar panel.

Further, the main system architecture may include a housing manufactured from Carbon Fiber Compound (graphene) and Copper Tapes, with an inner clip of the "ceramic layer", to construct 40×40×30 CM instrument enclosure.

Further, the housing may include NdFeB permanent magnet—N52. Further, the NdFeB permanent magnet—N52 creates a magnetic field. Further, the housing prevents the magnetic field from the electromagnetic interference (EMI). By reflection, absorbent, attenuation, etc. of shielding material to ensure that the electromagnetic field generated magnetic radiation does not enter the target area, in order to prevent RF interference.

Further, the material structure of the instrument's anti-magnetic interference shell may include a Carbon Fiber Compound (Graphene) (inner layer coated with 20-25 um conductive paint), Ceramic layer (protected from wear and corrosion), Conductive rubber (Max limit 120 dB/10 GHz), Conductive foam (Max limit 90 dB), Conductive cloth (Max limit 60-80 dB/30 MHz-1 GHz), Conductive cloth tape (Max limit 80 dB), and Copper Tape (thickness 20/50 mm).

Further, the main system architecture may include body structure (a skeleton) including a spatial position of the plate layers to place each NdFeB permanent magnet as to the ceiling and the ground layer of the chassis (Planar permanent magnet located in the bottom and top-level). Further, the body structure includes four stands with NdFeB permanent magnets (4 stands upright permanent magnet) supporting plate layers, and connected and fixed to the permanent ground floor.

Further, the plate layers and the four stands form a good uniform magnetic field. The permanent magnet does not need to consume electric power to maintain the magnetic field, but the temperature may cause the magnetic force to disappear. The weight and cost of rare earth materials have always hindered the development of MRI scanners. Further, a minimum magnet weight is required to increase the portability of the scanner. However, higher $B_0$ can usually be obtained using rarer earth materials. There is no maximum weight set, but the design may consider limiting the number of rare earth magnet blocks.

Further, the automatic telescoping may include surface coil and volume coil. With a carbon fiber compound for manufacturing robot (coupling side wall of the system), it may be controlled through the control center, with arms outstretched to the target sample (for example a tree stem). Further, a right arm link to the surface coil may go around the target sample. Further, the surface coil may be structured as follows: A section of an upright receiving coil formed surface coil. The upper and lower ends of the upright coils, a "segment linked to carbon fiber compound produced", and joined to a mechanical arm, forming "automate hand" design, in order to let order-instruction issued by the control center, may be transmitted to the end. This may be made according to sample size adjustment, the engagement tightness, to improve the signal to noise ratio (S/N), and resolution.

Further, a left arm link to the volume coil may cover the target sample. Further, the volume coil may be constructed as follows: Coil bobbin established may mimic the human brain. Further, a circular cover with a vertical coil from top to bottom, to the joint-like configuration, to shrink the volume coil, tightly-containing the target sample. It must have an opening hole of magnet to insert the sample into the hole. The diameter of the opening may be at least 5 cm. The magnet may be designed to fit snugly to the head to maximize B. Similar to the head-mounted gradient coil design, the magnet may be held above the specimen. The sample center may usually be assumed to be 3 cm above the tree trunk (branch), so if the magnet is symmetrical to the sample center, the length limit is 10 cm.

Further, the eyes "Near-infrared photography" (with VNIR multi-spectral Imaging Camera/400-1,000 nm or 770-1500 nm), in the chassis may focus on the "target sample". Further, VNIR may be used for obtaining a detailed tissue spectrum of plants (for example plant stem volume, section number/root angle, distribution/leaf spot/seed color) for analysis of metabolic activity.

Further, within a bird's-eye for shaping sample size, the parameters of environment condition may be collected by sensors. Further, the bird's-ee view with "temperature and humidity measurements sensor and non-power fluorescence imaging sensor", for fluorescence image collection of plant photosynthesis chlorophyll.

Further, a "10×10 cm tempered glass light transmission window" may be placed above a chassis frame to allow the incident light to get into within the enclosure. Further, the placement of temperature adjustment device (AIR Thermos Assemble Cooling Control) may be used to control the ambient temperature, to avoid permanent magnet reaches 80 degrees Celsius. However, the permanent magnetic field drift may change reversibly with temperature. The temperature change rate is a temperature coefficient. The temperature coefficient of rare earth magnets varies.

Further, the main system may include a hole in the upper and lower sections to allow the sample (for example a tree) to penetrate. This allows keeping the life-sustaining activities of the natural environment. The hole includes resilient foam (RF shielding material) placed into a circle, to prevent EMI. Further, the elastic foam may be a tight circle around the sample, to reduce the gap of "holes" and "sample", to increase tightness.

Further, the left and right half of the chassis hangs on a track. Further, the outer sides of the upper and lower layers of the chassis are concave, wherein 55 cm slide rails are in the concave shape so that the chassis can move freely on the slide rails.

Further, the left and right side of the chassis may transfer energy as explained below. The sensing components of the main controller may receive an automatically chassis command center, programmed with a program of instructions by the manifold internal mass, and send the corresponding command to the command electric motor, or locks the system work. Further, people may simultaneously adjust the master left chassis opening speed, opening range and other parameters.

Further, the induction detectors include two main types: microwave sensors and infrared sensors. They are responsible for collecting external signals. When a moving object enters its working range, it gives a pulse signal to the main controller. Further, a power motor may provide the main power for separation and tightening, and control the acceleration and deceleration of the chassis. Further, a chassis running track may be just like the rails of a train. Further, the spreader wheel system of the chassis is restricted to make it travel in a specific direction. Further, the chassis spreader wheel system may be used to suspend the left and right chassis and drive the chassis to run under power traction. Further, a synchronous belt (or V-belt) may be used to transmit the power generated by the motor and to pull the chassis spreader wheel system. Further, a lower guide system, that is, a chassis lower portion of the guide and positioning means, may prevent the cabinet front door swung at run time.

Further, an induction door machine may be installed in the automatic induction case, which is a collective name for a series of components that control the automatic case to open and close.

Further, when the two chassis close, both sides of the upper surface of each shackle may be decentralized from left to right, to a fixed chassis which is integrally joined.

Further, there may be two options for the close design of electromagnetic wave interference prevention at the joint of the two cases. First case includes the upper-left of the chassis, within approximately 10 centimeters, extended with "three RF shielding materials" screen parallel barrier, pulled right above the chassis, the bottom, back to the starting line of the left upper cabinet, the two chassis joint completely concealed under the RF shielding material. The second case includes the left and right chassis connected about 3 centimeters from the right side of the left chassis. It may be made of RF shielding materials of length 5 cm from the left side of the left chassis, connected to the right side of the right chassis (about 2 cm location of the left edge of right chassis).

Further, from the right upper side of the right chassis, about 3 centimeters (Uplift 1 cm), there has been made of RF shielding materials of length 5 cm, from the right side of the right chassis, connected to the left side of the left chassis (2 cm lines in the right side of the left chassis). Further, the joints on the four sides of the left and right chassis, as above, strengthen the joint RF shielding protection.

Further, a design "pulley" under the chassis may include a hand wheel or an electric pulley. This may be linked to a central control center, in order to control the action.

The disclosed systems are developed according to people-oriented science and technology principles. Accordingly, the disclosed systems allow usage by people who do not have complex learning, adapt to the natural human instinct, and can be applied immediately.

Figure 5:
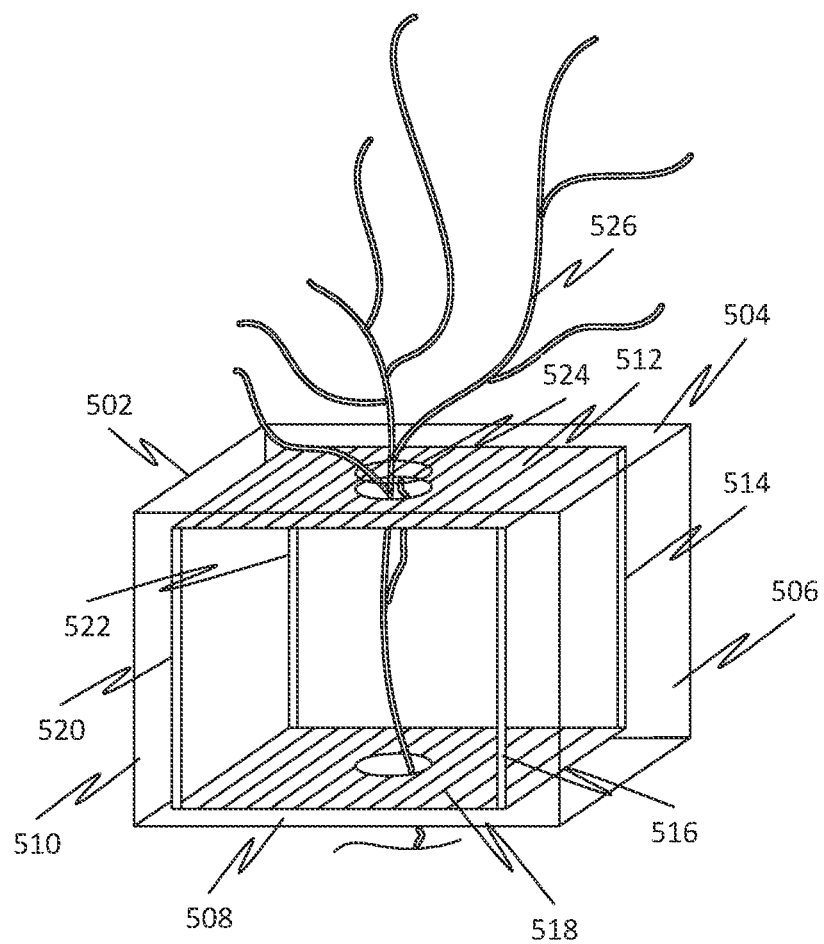
FIG. 5 is a schematic of a frame body of a system for facilitating non-invasive in-situ imaging of metabolic processes of plants, in accordance with some embodiments.

FIG. 5 is a schematic of a frame body 502 of a system for facilitating non-invasive in-situ imaging of metabolic processes of plants, in accordance with some embodiments. Further, the frame body 502 may include one or more frame walls 504-510 and a frame enclosure formed by the one or more frame walls 504-510. Further, the one or more rare-earth permanent magnets 512-522 is disposed within the frame enclosure.

According to some embodiments, the one or more frame walls 504-510 may include at least one composite material. Further, the at least one composite material may include carbon fiber and copper. Further, the at least one composite material may provide electromagnetic shielding to the frame enclosure.

Further, the frame wall 504 may include a frame wall opening 524. Similarly, the frame wall 508 may include a frame wall opening (not shown) allowing the frame enclosure to receive a plant sample 526.

Figure 6:
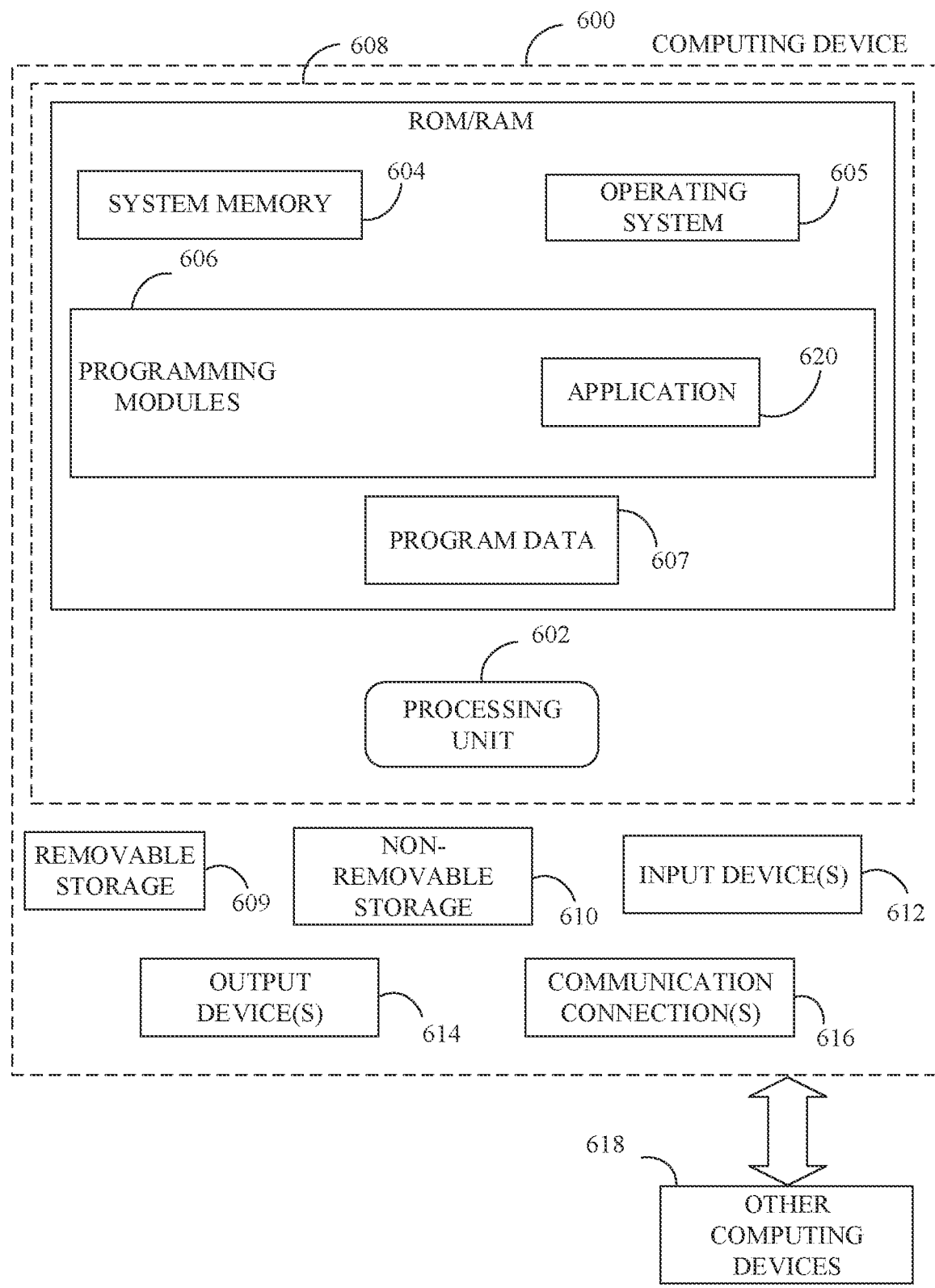
FIG. 6 is a block diagram of a computing device for implementing the methods disclosed herein, in accordance with some embodiments.

With reference to FIG. 6, a system consistent with an embodiment of the disclosure may include a computing device or cloud service, such as computing device 600. In a basic configuration, computing device 600 may include at least one processing unit 602 and a system memory 604. Depending on the configuration and type of computing device, system memory 604 may comprise, but is not limited to, volatile (e.g. random-access memory (RAM)), non-volatile (e.g. read-only memory (ROM)), flash memory, or any combination. System memory 604 may include operating system 605, one or more programming modules 606, and may include a program data 607. Operating system 605, for example, may be suitable for controlling computing device 600's operation. In one embodiment, programming modules 606 may include image-processing module, machine learning module. Furthermore, embodiments of the disclosure may be practiced in conjunction with a graphics library, other operating systems, or any other application program and is not limited to any particular application or system. This basic configuration is illustrated in FIG. 6 by those components within a dashed line 608.

Computing device 600 may have additional features or functionality. For example, computing device 600 may also include additional data storage devices (removable and/or non-removable) such as, for example, magnetic disks, optical disks, or tape. Such additional storage is illustrated in FIG. 6 by a removable storage 609 and a non-removable storage 610. Computer storage media may include volatile and non-volatile, removable and non-removable media implemented in any method or technology for storage of information, such as computer-readable instructions, data structures, program modules, or other data. System memory 604, removable storage 609, and non-removable storage 610 are all computer storage media examples (i.e., memory storage.) Computer storage media may include, but is not limited to, RAM, ROM, electrically erasable read-only memory (EEPROM), flash memory or other memory technology. CD-ROM, digital versatile disks (DVD) or other optical storage, magnetic cassettes, magnetic tape, magnetic disk storage or other magnetic storage devices, or any other medium which can be used to store information and which can be accessed by computing device 600. Any such computer storage media may be part of device 600. Computing device 600 may also have input device(s) 612 such as a keyboard, a mouse, a pen, a sound input device, a touch input device, a location sensor, a camera, a biometric sensor, etc. Output device(s) 614 such as a display, speakers, a printer, etc. may also be included. The aforementioned devices are examples and others may be used.

Computing device 600 may also contain a communication connection 616 that may allow device 600 to communicate with other computing devices 618, such as over a network in a distributed computing environment, for example, an intranet or the Internet. Communication connection 616 is one example of communication media. Communication media may typically be embodied by computer-readable instructions, data structures, program modules, or other data in a modulated data signal, such as a carrier wave or other transport mechanism, and includes any information delivery media. The term "modulated data signal" may describe a signal that has one or more characteristics set or changed in such a manner as to encode information in the signal. By way of example, and not limitation, communication media may include wired media such as a wired network or direct-wired connection, and wireless media such as acoustic, radio frequency (RF), infrared, and other wireless media. The term computer-readable media as used herein may include both storage media and communication media.

As stated above, a number of program modules and data files may be stored in system memory 604, including operating system 605. While executing on processing unit 602, programming modules 606 (e.g., application 620 such as a media player) may perform processes including, for example, one or more stages of methods, algorithms, systems, applications, servers, databases as described above. The aforementioned process is an example, and processing unit 602 may perform other processes.

Generally, consistent with embodiments of the disclosure, program modules may include routines, programs, components, data structures, and other types of structures that may perform particular tasks or that may implement particular abstract data types. Moreover, embodiments of the disclosure may be practiced with other computer system configurations, including hand-held devices, general-purpose graphics processor-based systems, multiprocessor systems, microprocessor-based or programmable consumer electronics, application-specific integrated circuit-based electronics, minicomputers, mainframe computers, and the like. Embodiments of the disclosure may also be practiced in distributed computing environments where tasks are performed by remote processing devices that are linked through a communications network. In a distributed computing environment, program modules may be located in both local and remote memory storage devices.

Furthermore, embodiments of the disclosure may be practiced in an electrical circuit comprising discrete electronic elements, packaged or integrated electronic chips containing logic gates, a circuit utilizing a microprocessor, or on a single chip containing electronic elements or microprocessors. Embodiments of the disclosure may also be practiced using other technologies capable of performing logical operations such as, for example, AND, OR, and NOT, including but not limited to mechanical, optical, fluidic, and quantum technologies. In addition, embodiments of the disclosure may be practiced within a general-purpose computer or in any other circuits or systems.

Embodiments of the disclosure, for example, may be implemented as a computer process (method), a computing system, or as an article of manufacture, such as a computer program product or computer-readable media. The computer program product may be a computer storage media readable by a computer system and encoding a computer program of instructions for executing a computer process. The computer program product may also be a propagated signal on a carrier readable by a computing system and encoding a computer program of instructions for executing a computer process. Accordingly, the present disclosure may be embodied in hardware and/or in software (including firmware, resident software, micro-code, etc.). In other words, embodiments of the present disclosure may take the form of a computer program product on a computer-usable or computer-readable storage medium having computer-usable or computer-readable program code embodied in the medium for use by or in connection with an instruction execution system. A computer-usable or computer-readable medium may be any medium that can contain, store, communicate, propagate, or transport the program for use by or in connection with the instruction execution system, apparatus, or device.

The computer-usable or computer-readable medium may be, for example, but not limited to, an electronic, magnetic, optical, electromagnetic, infrared, or semiconductor system, apparatus, device, or propagation medium. More specific computer-readable medium examples (a non-exhaustive list), the computer-readable medium may include the following: an electrical connection having one or more wires, a portable computer diskette, a random-access memory (RAM), a read-only memory (ROM), an erasable programmable read-only memory (EPROM or Flash memory), an optical fiber, and a portable compact disc read-only memory (CD-ROM). Note that the computer-usable or computer-readable medium could even be paper or another suitable medium upon which the program is printed, as the program can be electronically captured, via, for instance, optical scanning of the paper or other medium, then compiled, interpreted, or otherwise processed in a suitable manner, if necessary, and then stored in a computer memory.

Embodiments of the present disclosure, for example, are described above with reference to block diagrams and/or operational illustrations of methods, systems, and computer program products according to embodiments of the disclosure. The functions/acts noted in the blocks may occur out of the order as shown in any flowchart. For example, two blocks shown in succession may in fact be executed substantially concurrently or the blocks may sometimes be executed in the reverse order, depending upon the functionality/acts involved.

While certain embodiments of the disclosure have been described, other embodiments may exist. Furthermore, although embodiments of the present disclosure have been described as being associated with data stored in memory and other storage mediums, data can also be stored on or read from other types of computer-readable media, such as secondary storage devices, like hard disks, solid state storage (e.g., USB drive), or a CD-ROM, a carrier wave from the Internet, or other forms of RAM or ROM. Further, the disclosed methods' stages may be modified in any manner, including by reordering stages and/or inserting or deleting stages, without departing from the disclosure.

Although the present disclosure has been explained in relation to its preferred embodiment, it is to be understood that many other possible modifications and variations can be made without departing from the spirit and scope of the disclosure.

The following is claimed:

1. A system for facilitating non-invasive in-situ imaging of metabolic processes of plants, the system comprising:
    a frame comprises a frame body and a base member, wherein the base member is configured to be placed on at least one surface, wherein the base member is configured for supporting the frame body;
    at least one rare-earth permanent magnet disposed on the frame, wherein the at least one rare-earth permanent magnet configured for creating a magnetic field around at least one plant sample, wherein the at least one rare-earth permanent magnet facilitates excitation of the at least one plant sample,
    at least one arm coupled to the frame, wherein the at least one arm is configured to move through a plurality of arm positions in relation to the frame;
    at least one coil disposed on a first end of an arm of the at least one arm, wherein the at least one coil is configured for partly encompassing the at least one plant sample, wherein the at least one coil facilitates the excitation of the at least one plant sample, wherein the at least one coil is configured for receiving at least one response from the at least one plant sample corresponding to the excitation;
    at least one sensor disposed on the frame, wherein the at least one sensor is configured for generating at least one sensor data, wherein the at least one sensor data is associated with at least one characteristic of the at least one plant sample;
    a processing device communicatively coupled with the at least one sensor and the at least one coil, wherein the processing device is configured for:
        analyzing the at least one sensor data;
        generating an arm control command based on the analyzing;
        processing the at least one response; and
        generating plant data associated with at least one metabolic process of the at least one plant sample based on the processing;
    an actuator communicatively coupled with the processing device, wherein the actuator is operationally coupled with the at least one arm, wherein the actuator is configured for moving the at least one arm through the plurality of arm positions based on the arm control command; and a presentation device disposed on the frame, wherein the presentation device is communicatively coupled with the processing device, wherein the presentation device is configured for presenting the plant data.

2. The system of claim 1, wherein the frame body comprises at least one frame wall and a frame enclosure formed by the at least one frame wall, wherein the at least one rare-earth permanent magnet is disposed within the frame enclosure.

3. The system of claim 2, wherein the at least one frame wall comprises at least one composite material, wherein the at least one composite material comprises carbon fiber and copper, wherein the at least one composite material provides electromagnetic shielding to the frame enclosure.

4. The system of claim 1, wherein the at least one rare-earth permanent magnet comprises two planer rare-earth permanent magnets and four upright rare-earth permanent magnets, wherein a first planer rare-earth permanent magnet is disposed juxtaposed to a second planer rare-earth permanent magnet, wherein each upright rare-earth permanent magnet of the four upright permanent magnets comprises a first upright end and a second upright end, wherein the first upright end is attached to a first distal end of the first planar rare-earth permanent magnet and the second upright end is attached to a second distal end of the second planar rare-earth permanent magnet, wherein the first distal end is juxtaposed to the second distal end.

5. The system of claim 1, wherein the arm of the at least one arm comprises a primary arm section nested in a secondary arm section, wherein the primary arm section is extendably coupled with the secondary arm section, wherein the primary arm section is configured for extending through a plurality of arm positions along an arm axis in relation to the secondary arm section.

6. The system of claim 5, wherein the processing device is configured for generating the arm control command based on the analyzing, wherein the actuator is configured for extending the primary arm section through the plurality of arm positions along the arm axis in relation to the secondary arm section based on the arm control command.

7. The system of claim 1, wherein the arm of the at least one arm comprises a primary arm section rotatably coupled with a secondary arm section, wherein the primary arm section is configured for rotating through a plurality of arm positions around a rotating axis in relation to the secondary arm section.

8. The system of claim 7, wherein the processing device is configured for generating the arm control command based on the analyzing, wherein the actuator is configured for rotating the primary arm section through the plurality of arm positions around the rotating axis in relation to the secondary arm section based on the arm control command.

9. The system of claim 1 further comprising a visible and near infrared (VNIR) camera disposed on the frame, wherein the VNIR camera is configured for generating at least one VNIR data, wherein the at least one VNIR data is associated with at least one metabolic process of the at least one plant sample, wherein the processing device is communicatively coupled with the VNIR camera, wherein the processing device is configured for processing the at least one VNIR data, wherein the plant data is generated based on the processing of the at least one VNIR data.

10. The system of claim 1 further comprising a non-power fluorescence imaging sensor disposed on the frame, wherein the non-power fluorescence imaging sensor is configured for generating at least one fluorescence data, wherein the at least one fluorescence data is associated with a photosynthesis process of the at least one metabolic process of the at least one plant sample, wherein the processing device is communicatively coupled with the non-power fluorescence imaging sensor, wherein the processing device is configured for processing the at least one fluorescence data, wherein the plant data is generated based on the processing of the fluorescence image data.

11. The system of claim 1 further comprising:
at least one temperature sensor disposed on the frame body, wherein the at least one temperature sensor is configured for generating at least one temperature data associated with the at least one rare-earth permanent magnet, wherein the processing device communicatively coupled with the at least one temperature sensor, wherein the processing device is configured for:
analyzing the at least one temperature data; and
generating a temperature command based on the analyzing of the at least one temperature data; and
at least one air cooling assembly disposed on the frame, wherein the at least one air cooling assembly is communicatively coupled with the processing device, wherein the at least one air cooling assembly configured for controlling an ambient temperature associated with the at least one rare-earth permanent magnet based on the temperature command.

12. The system of claim 1 further comprising a storage device communicatively coupled with the processing device, wherein the storage device is configured for retrieving historical plant data associated with the at least one plant sample from a database, wherein the processing device is configured for:
analyzing the historical plant data and the plant data; and
generating processed plant data based on the analyzing of the historical plant data and the plant data, wherein the presentation device is configured for presenting the processed plant data.

13. The system of claim 1, wherein the frame comprising a first body portion and a second body portion, wherein the first body portion is coupled to the second body portion using at least one coupling mechanism, wherein the first body portion is configured to move through a plurality of body positions in relation to the second body portion forming a body interior space, wherein the body interior space is configured for receiving the at least one plant sample.

14. The system of claim 13, wherein the processing device is configured for generating a frame control command based on the analyzing, wherein the actuator is operationally coupled with the frame, wherein the actuator is configured for moving the first body portion through the plurality of body positions in relation to the second body portion based on the frame control command.

* * * * *